United States Patent [19]

Tenney et al.

[11] Patent Number: 5,011,730

[45] Date of Patent: Apr. 30, 1991

[54] BULK POLYMERIZED CYCLOOLEFIN CIRCUIT BOARDS

[75] Inventors: Lindwood P. Tenney, Birmingham, Ala.; David J. Smith, Sheffield Lake, Ohio; Dennis J. Janda, Parma, Ohio; Dennis A. Barnes, Medina, Ohio

[73] Assignee: B. F. Goodrich, Akron, Ohio

[21] Appl. No.: 336,373

[22] Filed: Apr. 11, 1989

Related U.S. Application Data

[63] Continuation of Ser. No. 85,489, Aug. 14, 1987, abandoned.

[51] Int. Cl.$^5$ .............................................. B32B 9/00
[52] U.S. Cl. ................... 428/209; 428/411.1; 428/457; 428/461; 428/500; 428/516; 428/901; 526/161; 526/166; 526/169; 526/281; 526/283; 264/104
[58] Field of Search ................ 428/209, 411.1, 457, 428/461, 500, 516, 901; 526/161, 166, 169, 281, 283; 264/104

[56] References Cited

U.S. PATENT DOCUMENTS

| | | |
|---|---|---|
| 1,720,029 | 7/1929 | Staudinger et al. . |
| 2,721,189 | 10/1955 | Anderson et al. . |
| 2,831,037 | 4/1958 | Schmerling . |
| 2,932,630 | 4/1960 | Robinson et al. . |
| 3,074,918 | 1/1963 | Elenterio . |
| 3,084,147 | 4/1963 | Wilks . |
| 3,330,815 | 7/1967 | McKeon et al. . |
| 3,367,924 | 2/1968 | Rinehart . |
| 3,422,178 | 1/1969 | Junker et al. .................. 264/216 |
| 3,467,633 | 9/1969 | Harris et al. . |
| 3,546,183 | 12/1970 | Vergne et al. . |
| 3,557,072 | 1/1971 | Vergne et al. . |
| 3,663,493 | 5/1972 | Miller .................. 260/31.8 M |
| 3,701,812 | 10/1972 | Gebhart, Jr. et al. . |
| 3,778,420 | 12/1973 | Brown et al. . |
| 3,781,257 | 12/1973 | Pampus et al. . |
| 3,790,545 | 2/1974 | Michak . |
| 3,836,593 | 9/1974 | Streck et al. . |
| 3,853,830 | 12/1974 | Minchak . |
| 3,879,343 | 4/1975 | DeBrunner et al. . |
| 4,002,815 | 1/1977 | Minchak . |
| 4,020,021 | 4/1977 | Lahouste et al. . |
| 4,077,755 | 3/1978 | Kato .................. 425/146 |
| 4,136,247 | 1/1979 | Tenney et al. . |
| 4,136,248 | 1/1979 | Tenney . |
| 4,138,419 | 2/1979 | Arakawa et al. . |
| 4,178,424 | 12/1979 | Tenney et al. . |
| 4,380,617 | 4/1983 | Minchak et al. . |
| 4,418,178 | 11/1983 | DeWitt . |
| 4,418,179 | 11/1983 | DeWitt et al. . |
| 4,426,502 | 1/1984 | Minchak . |
| 4,436,858 | 3/1984 | Klosiewicz .................. 524/296 |
| 4,490,498 | 12/1984 | Yokota et al. . |
| 4,496,668 | 1/1985 | Newburg . |
| 4,535,097 | 8/1985 | Newburg . |
| 4,558,107 | 12/1985 | Evans et al. . |
| 4,568,660 | 2/1986 | Klosiewicz . |
| 4,584,425 | 4/1986 | Tom . |
| 4,590,219 | 5/1986 | Nissen et al. .................. 521/51 |
| 4,598,102 | 7/1986 | Leach . |
| 4,604,408 | 8/1986 | Newburg . |
| 4,604,447 | 8/1986 | Malpass, Jr. . |
| 4,607,077 | 8/1986 | Silver et al. . |
| 4,657,981 | 4/1987 | Klosiewicz . |
| 4,661,575 | 4/1987 | Tom . |
| 4,680,155 | 7/1987 | Rochefort et al. .................. 264/73 |
| 4,689,380 | 8/1987 | Nahm . |
| 4,696,985 | 9/1987 | Martin . |
| 4,699,963 | 10/1987 | Klosiewicz . |
| 4,701,510 | 10/1987 | Minchak et al. . |
| 4,703,098 | 10/1987 | Matlack . |
| 4,708,969 | 11/1987 | Leach . |
| 4,740,537 | 4/1988 | Silver . |
| 4,748,216 | 5/1988 | Tom . |
| 4,751,337 | 6/1988 | Espy et al. . |

FOREIGN PATENT DOCUMENTS

| | | |
|---|---|---|
| 0181640 | 5/1986 | European Pat. Off. . |
| 0226957 | 7/1987 | European Pat. Off. . |
| 60-26024 | 2/1985 | Japan . |
| 60-049051 | 3/1985 | Japan . |
| 62-052987 | 7/1987 | Japan . |

*Primary Examiner*—Patrick J. Ryan
*Attorney, Agent, or Firm*—Venable, Baetjer, Howard & Civiletti

[57] ABSTRACT

Dielectric supports for electronic components, such as circuit boards, are provided which are comprised of two or more bulk polymerized norbornene-type monomers. The monomers may be easily processed into circuit boards, etc. by reaction injection molding. The copolymers obtained exhibit high heat distortion temperatures and good dielectric properties and a balance of properties that make them, for example, well suited for molded wire board materials.

38 Claims, No Drawings

BULK POLYMERIZED CYCLOOLEFIN CIRCUIT BOARDS

Related U.S. Application

This is a continuation of U.S. Ser. No. 085,489, filed Aug. 14, 1987 now abandoned.

BACKGROUND OF THE INVENTION

A common dielectric support for electronic components is often referred to as a circuit board. The traditional method of making these circuit boards is to impregnate woven glass fibers with epoxy resin precursors. These impregnated fibers are then pressed between two copper sheets at a high temperature for several hours to cure. The result is a copper clad board which can be further processed by etching, soldering and drilling to incorporate wires, electronic components or printed circuits thereon. The epoxy resin boards have good dielectric properties and high heat distortion temperatures. These traditional processes suffer in that the cure time is lengthy, which adds to the cost of the finished product and it is difficult to obtain shapes other than flat circuit boards by this process.

Another, more simplified method for producing circuit boards is by injection molding engineering plastics. Such methods are more rapid than traditional processes. The engineering plastics such as polyetherimide and polysulfone are distinguished from commodity plastics, such as polystyrene, in that they exhibit higher heat distortion temperatures, impact resistance and higher continuous use temperatures. For these features, a premium price is obtained. Because of this premium price, it is common practice in commercial industries to economize by balancing price versus the properties desired when selecting a polymer. Therefore, there is a continuing effort to provide materials with superior properties as well as a novel balance of properties for specialized applications.

For example, in preparing injection molded dielectric supports for electronic components, polymers with a high heat distortion temperature (Hdt) are required so that the integrity of the finished article is unaffected by the heat which generates from operation of the circuits. However, engineering polymers which exhibit high heat distortion temperatures characteristically exhibit correspondingly high glass transition temperatures ($T_g$) and require more energy to process. Therefore, it may not be desirable to utilize materials with Hdt values higher than those necessary for the desired application. Polyetherimides are engineering polymers with excellent Hdt values for dielectric supports. However, they must be processed at high temperatures and high pressure because of their high Tg values and where the final product will not be exposed to extreme heat, the use of polyetherimides may be disadvantageous.

The present invention provides dielectric supports comprised of copolymers with a unique property profile. These copolymers have dielectric properties superior to epoxy resins, good Hdt valves and can be easily molded into finished products by utilizing a bulk polymerization process. The dielectric supports have the added features of low moisture absorption and good surface reactivity.

The copolymers used in the present invention are bulk polymerized to provide the desired dielectric supports. Common bulk polymerization techniques are reaction injection molding (RIM) and resin transfer molding (RTM). Both methods are known to provide shaped articles under relatively mild molding conditions, i.e., lower temperatures and pressures. In RIM processes, a low molecular weight polymer precursor or a reactive monomer is injected into a mold and is polymerized in bulk, i.e., without solvent or diluent to form the final product. The polymer precursor is typically a liquid monomer or an oligomer which exhibits a relatively low glass transition temperature and low melt viscosity, which simplifies transfer of the material into the mold. RTM is a method similar to RIM, the major differences being the speed with which reactants are transferred to the mold and the mixing of reactive components in that it is done at lower pressures. RTM is normally slower than the RIM process.

RIM and RTM processes are effective for a limited number of polymerized copolymers in that not all monomers/oligomers provide a solvent medium for a curing catalyst which generates polymer at a high degree of monomer conversion.

The copolymer used in the present invention is derived from two or more ring-opened polymerized norbornene-type monomers obtained by bulk polymerization. Minchak describes bulk polymerization and reaction injection molding of norbornene type monomers in U.S. Pat. No. 4,426,502. However, Minchak does not provide the dielectric supports of this invention which take advantage of the high cross-link density of copolymers derived from two or more norbornene type monomers to provide a unique property profile.

SUMMARY OF THE INVENTION

The present invention provides a dielectric support for electronic components wherein said dielectric support is comprised of copolymers of bulk polymerized monomers. These monomers comprise ring-opening polymerizable norbornene-type monomers which have low viscosities and flow easily. The copolymers obtained by bulk polymerization have high heat distortion temperature values, good dielectric constant values and show low moisture absorption. Unsaturation within the copolymers permits crosslinking and provides sites for subsequent reactions. In preferred embodiments, the copolymers can be made using a halogen free catalyst/cocatalyst system.

DETAILED DESCRIPTION OF THE PREFERRED EMBODIMENTS

The dielectric supports of this invention encompass those substrates which insulate and support electronic components, such as microprocessors, transistors, resistors, capacitors, conductive leads/wires and the like which are visible to and discernible by the human eye. The circuits are usually completed with wires or by a thin conductive layer which is patterned on the surface by either selective etching or selective deposition. However, the dielectric supports of this invention do not include those used to support integrated circuits, typically comprised of silicon wafers. Integrated circuits are defined herein as circuits having electronic components obtained by photolithography which are undescernible by the unaided eye.

Circuit boards are dielectric supports which fall within the scope of this invention. Circuit boards are generally flat and planar in structure, but those of this invention may have a profiled surface to enhance insulation and/or support of the electronic components. A profiled surface can be easily obtained where the dielectric supports are produced by an injection molding processes, such as RIM or RTM.

The dielectric supports of this invention are comprised of two or more bulk polymerized norbornene-type monomers. The norbornene-type monomers that are bulk polymerized are characterized by the presence of the norbornene group, which is defined structurally by Formula I below:

I

Pursuant to this definition, suitable norbornene-type monomers include substituted and unsubstituted norbornene, dicyclopentadiene, dihydrodicyclopentadiene, tricyclopentadiene, and tetracyclododecene. Examples of norbornene-type monomers are those which conform to Formulas II and III below:

II

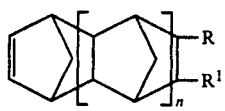
III where n is a whole number of from 1–10 and R and $R^1$ are (1) independently selected from hydrogen, alkyl groups of 1–12 carbon atoms, alkylene groups of 2–12 carbon atoms, cycloalkyl groups of from 6–20 carbon atoms and aryl groups of from 6–20 carbon atoms, or are (2) combined together to form saturated and unsaturated cyclic groups of 4–12 carbon atoms with the two ring carbon atoms connected thereto. The two/ring carbon atoms contribute to and form part of the 4–12 carbon atoms within the cyclic group.

In more preferred embodiments, n is a whole number of from 1–6 and R and $R^1$ are selected from hydrogen, alkyl groups of from 1–3 carbon atoms or are combined together to form mono-unsaturated hydrocarbon cyclic groups containing 5 carbon atoms with the two ring carbon atoms. In reference to Formula III, where n is greater than 1, R and $R^1$ most preferably combine together to form mono-unsaturated hydrocarbon cyclic groups containing 5 carbon atoms with the two ring carbon atoms.

Examples of monomers that conform to Formulas II and III include dicyclopentadiene, methyl-tetracyclododecene, hexacycloheptadecene, methyl-hexacycloheptadecene, 2-norbornene, 5-methyl-2-norbornene, 5,6-dimethyl-2-norbornene, 5-ethylidene-2-norbornene, 5-butyl-2-norbornene, 5-hexyl-2-norbornene, 5-octyl-2-norbornene, 5-dodecyl-2-norbornene and the like. Tricyclopentadiene (cyclopentadiene trimer), tetracyclopentadiene (cyclopentadiene tetramer), dihydrodicyclopentadiene also conform to Formulas II and III. Polar substituents are avoided since they can lead to undesirable moisture absorption. The norbornene-type monomers without polar functionality have excellent low moisture absorption values, normally a few hundredths of a percent.

Copolymers of the norbornene-type monomers have been found to exhibit high heat distortion temperatures (Hdt). The copolymers utilized in this invention preferably have values for Hdt above about 100° C. with dielectric constant values preferably ranging from 2.3 to 3.2.

This invention especially contemplates preparation of copolymers where cross-linking is aided by the presence of mono-unsaturated groups within the radicals R and $R^1$ originating from the norbornene-type monomers. Such unsaturation also provides sites for subsequent reactions. These unsaturated groups include (1)alkylene radicals and cycloalkylene radicals provided by R or $R^1$ independently and (2)mono-unsaturated cyclic groups formed by combining R and $R^1$.

The most common example of a norbornene-type monomer where R and $R^1$ combine to form a mono-unsaturated cyclic group is dicyclopentadiene. Other such monomers include cyclopentadiene trimer (tricyclopentadiene), cyclopentadiene tetramer (tetracyclopentadiene) and other polycyclic pentadienes of Formula III where n is greater than 3. Ethylidene-norbornene, cyclohexenyl norbornene and vinyl norbornene are common examples of norbornene-type monomers where R or $R^1$ independently provide mono-unsaturated groups. The olefinic repeating units formed upon polymerization may also provide cross-linking/reactivity; however, the mono-unsaturated cyclic groups provided by R and $R^1$ are more accessible for cross-linking and other reactions.

In preferred embodiments, at least 25 weight percent of the copolymer is comprised of polymerized monomers wherein R and $R^1$ form mono-unsaturated cyclic groups. More preferably, these monomers are dicyclopentadiene and comprise from 50–95 weight percent of the copolymer. Dicyclopentadiene provides good cross-linking, high heat distortion temperatures, is easily processed and is readily available.

Polycyclic pentadienes of Formula III, where n is greater than 1 and less than 10, are also desirable monomers in that they enhance the Hdt values of the copolymer beyond dicyclopentadiene and provide cross-linking when they possess unsaturation other than within the norbornene moiety. However, these monomers are more difficult to obtain and purity. At levels greater than 25 percent, these monomers will significantly enhance the heat distortion temperatures of the polymer made therefrom.

Cross-linking is generally desired so as to enhance the solvent resistance of the dielectric support, particularly if exposed to aggressive solvents during subsequent processing. Reactive sites, particularly at the surface of the dielectric support, may be desirable in subsequent processing, such as chemical vapor deposition, electroless plating, etc.

The mixture of norbornene-type monomers can contain up to about 20% by weight thereof of one or more other polymerizable monomers. These other polymerizable monomers are preferably selected from mono and bicycloolefins containing 4–12 carbon atoms, preferably 4–8 carbon atoms, examples of which include cyclobutene, cyclopentene, cycloheptene, cyclooctene, cyclooctadiene, cyclodecene, cyclododecene, cyclododecadiene and cyclododecatriene. Also suitable are bicyclic olefins containing 7–16 carbon atoms and 1–4 double bonds preferably 8–12 carbon atoms and 2–3 double bonds such as norbornadiene.

The monomers utilized herein are polymerized in bulk to obtain the dielectric supports of this invention. Bulk polymerization is defined as polymerization in the absence of a solvent or diluent. An important feature in bulk polymerizations is the catalyst system utilized. Many metathesis catalysts will provide the ring-opening polymerization of the norbornene-type monomers. However, it is preferable to maintain the polymerized product as low in a halogen content as possible. In addition, some catalysts are too rapid and uncontrollable for bulk polymerization.

U.S. Pat. No. 4,426,502, assigned to the same assignee as the present invention, discloses a bulk polymerization process wherein alkylalkoxyaluminum halide co-catalysts are used with halogen free tungsten or molybdenum catalyst compounds. This catalyst/co-catalysts system was found to retard polymerization at room temperature long enough to permit mixing of the monomers, fillers, additives and catalysts and permit molding into finished articles. Although the co-catalysts contain halogen, the catalyst is halogen free in this system.

Suitable halogen free catalysts, as described in U.S. Pat. No. 4,426,502, are organo ammonium molybdates and tungstates that conform to the formulas defined below:

$$[R'_4N]_{(2y-6x)}M_xO_y \qquad \text{V}$$

and $$[R''_3NH]_{(2y-6x)}M_xO_y \qquad \text{VI}$$

where O represents oxygen; M represents either molybdenum or tungsten; x and y represent the number of M and O atoms in the molecule based on a valence of +6 for molybdenum, +6 for tungsten and −2 for oxygen; and the R' and R'' radicals can be the same or different and are selected from hydrogen, alkyl, alkylene groups each containing from 1-20 carbon atoms, and cyclo aliphatic groups each containing 5-16 carbon atoms. All of the R' and R'' radicals cannot be hydrogens or short chained carbon atoms since such a condition will render the molecule essentially insoluble in hydrocarbons and most organic solvents. In a preferred embodiment, the R' radicals are selected from alkyl groups each containing 1-18 carbon atoms wherein the sum of carbon atoms on all of the R' radicals is from 20-72, more preferably from 25-48. In another preferred embodiment, the R'' radicals are selected from alkyl groups each containing 1-18 carbon atoms wherein the sum of carbon atoms on all of the R'' radicals is from 15-54, more preferably from 21-42.

It has been found that in the case of the organo-ammonium molybdates and tungstates represented by Formula V, where all R¹ radicals are the same, each can contain from 4-18 carbon atoms. Where three R' radicals are the same, each containing from 7-18 carbon atoms, the remaining R' radical can contain from 1-18 carbon atoms. Where three R' radicals are the same, each containing 4-6 carbon atoms, the remaining R' radical can contain 4-18 carbon atoms. In the case where two of the four R' radicals are the same, the two same radicals can each contain 12-18 carbon atoms and the remaining two R' radicals can contain from 1-18 carbon atoms. With respect to each other, the remaining two R' radicals can be the same or different as long as each contains 1-18 carbon atoms. Where all R' radicals are different, the sum thereof can be in the range of 20-72 carbon atoms.

Similar remarks apply to organo-ammonium molybdates and tungstates that are defined by Formula VI. The R'' radicals cannot be too small if the molecule is to be soluble in a hydrocarbon reaction solvent and/or a norbornene-type monomer. Where all R'' radicals are the same in the above formula, each can contain from 5-18 carbon atoms. Where two R'' radicals are the same or all the R'' radicals are different, each can contain from 1-18 carbon atoms and the sum thereof can be in the range of 15-72 carbon atoms. Included herein are also compounds wherein one R'' radical is hydrogen in which case the remaining two R'' radicals each contain 12 carbon atoms and greater, i.e., 12-18 carbon atoms.

Specific examples of suitable organo-ammonium molybdates and tungstates described herein include tri(dodecyl)ammonium molybdates and tungstates, methyltricaprylammonium molybdates and tungstates, tri(tridecyl)ammonium molybdates and tungstates, and trioctylammonium molybdates and tungstates. The organo-ammonium molybdate or tungstate or mixture thereof is employed at a level of about 0.01-50 millimoles molybdenum or tungsten per mole of total monomer, preferably 0.1-10 millimoles.

Suitable aluminum halide co-catalysts conform to the following formula:

$$(R^2O)_aR^3_bAlX_c \qquad \text{IV}$$

where R² is an alkyl or phenyl radical containing about 1-18 carbon atoms, preferably 2-4; R³ is an alkyl radical containing 1-18 carbon atoms, preferably 2-4; X is a halogen selected from chlorine, iodine, bromine and fluorine, preferably chlorine and iodine; "a" is the number of equivalents of alkoxy or aryloxy radicals (R²O) and can vary from a minimum of about 0.5 to a maximum of about 2.5 and is preferably from about 1 to about 1.75; "b" indicates the number of equivalents of alkyl group R³ and can vary from a minimum of about 0.25 to a maximum of about 2 and is preferably from about 0.5 to about 1; and "c" is the number of equivalents of halogen X and can vary from a minimum of about 0.5 to a maximum of about 2, preferably from about 0.75 to about 1.25. The sum of a, b and c must equal 3.0. The preferred ratio of alkoxy or aryloxy groups to aluminum is better defined by the area A, B, C and D in FIG. 1 of U.S. Pat. No. 4,426,502, assigned to the same assignee as the present invention and incorporated herein by reference. The molar ratio of alkyl aluminum halide to the organo ammonium molybdate and/or tungstate is not critical and can be in the range of about 200:1 and higher to 0.1:1, preferably from 10:1-2:1 of aluminum to molybdenum or tungsten.

These co-catalysts are obtained by pre-reacting alcohols with the organo-aluminum halide co-catalysts. Alkoxy groups and aryloxy groups in the co-catalyst function to inhibit the reducing power of a co-catalyst by replacing some of the alkyl groups on the aluminum, thus making it possible to react the cyclic olefins via bulk polymerization. The alkoxy and aryloxy groups can be provided by alcohols or other hydroxyl containing materials that come in contact with the co-catalyst. The alcohol and co-catalyst can be reacted in situ, i.e., within the monomer mixture which is bulk polymerized. Fillers and phenolic stabilizers may provide the hydroxyl groups necessary to form the co-catalyst.

If the alcohol and co-catalyst are pre-reacted, suitable alcohols are those which form co-catalysts that are soluble in the cycloolefin monomer. Aryloxy groups are preferably derived from unhindered phenols and substituted or unsubstituted resorcinols. An especially preferred aryloxy group is the phenoxy group derived from a phenol that is unhindered at the 2 and 6 positions. Specific examples of such compounds are phenol itself and derivatives of unsubstituted resorcinol where one of the two hydroxyl groups is esterified, such as a benzoate. It should be understood that an excess of alcohol or hydroxyl containing compound should be avoided in that it will render the aluminum compound ineffective as a reducing agent or co-catalyst.

The co-catalysts of Formula IV described above must contain at least some halogen "X". However, halogen free co-catalysts can be used and are preferred in that the presence of halogen in the dielectric support can cause corrosion of the electronic circuits. Suitable halogen free co-catalysts are tri-alkyl aluminum compounds and alkyl aluminum hydrides. The alkyl groups in these aluminum compounds preferably contain from 2-4 carbon atoms. These co-catalysts are used in combination with either a modifier compound or hindered phenol and provide an acceptable degree of polymerization where elevated polymerization temperatures are used. Polymerization temperatures of 50°-200° C. are acceptable and polymerization temperatures above 90° C. are preferred.

Suitable modifier compounds are alkyl-tin-oxide and alkylalkoxy tin compounds such as bis(tri-alkyl tin) oxides of $C_2$-$C_{12}$ alkyl, bis(triphenyl tin) oxide and tri-n-butyl ethoxy tin. Suitable hindered phenols are substituted at the 2 and 6 position, preferably with t-butyl radicals.

To aid the rate of polymerization, an activator may be added to the monomer composition when desired. With activators, polymerization conversion may increase from about 80%-90% to over 97% of the monomers. Activators permit lower mold temperatures to be used because of the quick exotherms generated.

It should be noted the polymerization of the norbornene-type monomers is a ring-opening polymerization wherein the norbornene group is converted to an ethylene-1,3-cyclopentene structure.

Reaction injection molding is a preferred method for bulk polymerizing the norbornene type monomers to obtain the dielectric supports for electronic components of this invention. In reaction injection molding, the norbornene type monomer composition is often split into two halves, one half containing the catalyst with the other containing the co-catalyst. Other additives can be distributed in either or both tanks and care must be taken to avoid undesired pre-polymerization reactions. The monomer charges are maintained under a blanket of nitrogen or other inert gas.

The contents are impingment mixed at high pressures by piston or gear pumps at about room or ambient temperature within a mixing chamber and injected into a mold where reaction occurs. The mold is generally maintained at a temperature in excess of about 30° C. and preferably from about 40°-200° C. and most preferably from about 45°-130° C. These higher temperatures are utilized to initiate polymerization. It may take from about 0.25-0.5 minutes to fill a mold during which time, the mold temperature drops. After the mold is filled, the temperature of the mix rises, such as for example from about 60°-80° C. to about 230° C. in the next 2-30 seconds. At this time, polymerization is completed and the temperature begins to drop as the solid, molded object starts to cool. When sufficiently cooled, the mold is opened and the object removed.

Generally speaking, once the reaction is initiated at the mold temperature, it takes only 2-5 seconds for polymerization to take place. This of course generally depends on many variables such as the monomers and additives used, mold temperature, catalyst and co-catalyst system employed, etc. It is preferable to maintain the time to mold less than about 5 minutes, preferably less than 2 minutes. This is the time measured from the commencement of the filling to the time when the monomers have polymerized and the object is ready for removal.

Reaction injection molding (RIM) differs from injection molding in a number of important aspects. Injection molding is conducted at high pressure, i.e., about 10,000-20,000 psi by melting a solid resin and conveying it into a mold maintained below the resin melt temperature, the molten resin being above its melt temperature. The viscosity of the molten resin is generally in the range of about 50,000-1,000,000 cps and typically about 200,000 cps at these temperatures. For injection molding, solidification of the resin occurs in about 10-90 seconds, depending on the size of the molded product. There is no chemical reaction taking place in the injection molding process.

In a RIM process, the viscosity of the materials fed into the mold varies from about 50-10,000 cps, preferably about 100 to 1,500 cps, at injection temperatures varying from room temperature for urethanes to about 150° C. for lactams. In a RIM process, a chemical reaction takes place in the mold to transform monomers to a polymeric state.

Circuit boards of this invention may also be obtained by a laminating process wherein two sheets of two or more norbornene-type monomers, each having catalyst and co-catalyst, respectively, are heat rolled with or without a fiber network or other component in sheet form. The monomers are bulk polymerized as the sheets are heated and pressed together.

The dielectric supports for electronic components of this invention may contain constituents other than the ring-opened polymerized norbornene-type monomers. These additives must be mixed with the monomers prior to polymerization. Additives conventionally used in circuit boards may also be introduced into the dielectric supports of this invention. Examples include fillers and secondary polymers, such as polyesters, and polyalkylenes having a relatively low glass transition temperature. Where fillers are used, those which are preferred are often reinforcing glass fibers and networks of fibers, and coated glass fibers. Anti-static agents, flame retardants and impact modifiers are also suitable components for the dielectric supports of this invention. The additives must be selected so as not to adversely affect the polymerization activity of the catalyst and/or co-catalyst. It is preferable to maintain the quantity of such additives less than 70 weight percent of the total composition used to form the dielectric support.

EXPERIMENTAL

Simulated Reaction Injection Molding Process

Two formulations of norbornene-type monomer are made, A and B. Formulation A is made by dissolving an appropriate amount of a trialkylammonium molybdate catalyst in norbornene type monomer. This catalyst is typically in the form of a 0.125M solution in a dicyclopentadiene solvent (4-6 mls/100 gms monomer). Formulation B is made by dissolving an appropriate amount of cocatalyst in norbornene-type monomer. This cocatalyst is also added as a 0.5M solution in a dicyclopentadiene solvent (7-9 ml/100 gms monomer). Samples of Formulation A and B are transferred to clean, dry bottles at room temperature and put under a nitrogen blanket. A pouring spout with a nitrogen inlet is put onto the B Formulation bottle and the liquid contents injected into the Formulation A bottle with shaking to provide a mixture of about 70-80 gms. The A/B bottle is fitted with a pouring spout and the contents transferred or injected into a cavity mold $\frac{1}{8}"\times 8"\times 8"$ held at about 70° C. A thermocouple inserted into the mold allows for monitoring of the temperature. The time to the reaction exotherm varies depending upon numerous factors. After the exotherm, usually about 1.5-3.0 minutes, the temperature is allowed to approach room temperature and the mold is opened and the placque removed.

Percent conversion is an important measurement and is done by thermal gravimetric analysis on a DuPont 1090 Thermal Analyzer using the weight loss at 400° C. as an indication of unreacted monomer. If a flame retardant is in the formulation, the weight loss just prior to the flame retardant decomposition is reported.

Small Scale Bulk Polymerization Process

To speed up the process of preparing samples in the laboratory, the same results as a RIM process were obtained by combining all of the following ingredients: norbornene type monomer, antioxidant, cocatalyst and catalyst, with the trialkylammonium molybdate catalyst being added last, and injecting the mixture into a mold.

EXAMPLE I

Preparation of Plaques Comprised of Bulk Polymerized Copolymer

To a clean dry quart bottle under a nitrogen purge, the following ingredients were added at room temperature, with catalyst added last:

| Dicyclopentadiene (DCPD) | 71.25 grams |
| --- | --- |
| Methyltetracyclododecene | 3.75 grams |
| Hindered phenol Antioxidant (Ethyl 702) | 1.5 grams |
| Cocatalyst components | |
| (a) diethylaluminumchloride, 0.5 N in DCPD | 3.6 mls |
| (b) SiCl$_4$, 0.5 N in DCPD | 1.8 mls |
| (c) n-propanol, 1.0 N in DCPD | 1.8 mls |
| Molybdate catalyst, 0.1 N in DCPD [(C$_{12}$H$_{25}$)$_3$NH]$_4$ Mo$_8$O$_{26}$ | 4.5 mls |

The mixture was shaken and then injected by nitrogen pressure into a $\frac{1}{8}"\times 8"\times 8"$ cavity mold held at about 55° C. After about 1.75 minutes the exothermic reaction began and the temperature rose to about 159° C. The placque was allowed to cool and was demolded after about 15 minutes. Upon measurement of conversion, the product was found to be about 98% converted.

EXAMPLE II

Preparation of Plaques Comprised of Flame Retarded, Bulk Polymerized Copolymers

Two formulations were made in 50 gallon quantities.

Formulation A: The following components were mixed under a nitrogen blanket within a 55 gallon carbon steel drum, transferred to a 55 gallon polyethylene lined drum and maintained under a nitrogen blanket. The elastomer/filler blends were made by roll-milling and then granulating the milled mass.

| Dicyclopentadiene | 299.5 lbs. |
| --- | --- |
| Ethylidene norbornene | 24.3 lbs. |
| tri(dodecyl)ammonium molybdate catalyst | 1.42 lbs. |
| Hindered Phenol Antioxidant (Ethyl 702) | 13.5 lbs. |
| Kraton 1102 Elastomer/Carbon black at a 70/30 wt. ratio | 11.25 lbs. |
| TiO$_2$/Kraton 1102 Elastomer 30/70 wt. ratio | 14.0 lbs. |
| Antimony oxide (Sb$_2$O$_3$) | 36.0 lbs. |

Formulation B: The following components were mixed within a 55 gallon carbon steel drum under nitrogen, transferred to a 55 gallon polyethylene lined drum and maintained under nitrogen blanket.

| Dicyclopentadiene | 251.6 lbs. |
| --- | --- |
| Ethylidene norbornene | 20.4 lbs. |
| Decabromodiphenyl oxide | 101.5 lbs. |
| Cocatalyst | |
| Diethylaluminumchloride | 1.56 lbs. (neat) |
| Silicone tetrachloride | 1.10 lbs. |
| Kraton 1102 Elastomer/Carbon black at a 70/30 wt. ratio | 10.6 lbs. |
| Kraton 1102 Elastomer/TiO$_2$ at a 70/30 wt. ratio | 13.2 lbs. |

Formulation A (about 54 gms) and Formulation B (about 57 gms) were added to separate clean dry bottles under nitrogen purge at 100 m temperature. About 5.6 grams of 1/16" milled glass fibers were mixed into Formulation A and the mixture was degassed. About 1.4 ml of n-propyl alcohol (1.0M in dicyclopentadiene) were mixed into Formulation B and the solution degassed. Formulation B was transferred to Formulation A with agitation. This A/B mixture was transferred to an $\frac{1}{8}"$ thick placque mold which had been nitrogen purged and held at 70° C.

The exotherm from the reaction raised the temperature of the molded placque to about 156° C. and this placque was then cooled and removed from the mold after a total elapsed time of about 10 minutes. The percent conversion was found to be about 97%.

Analysis of Dielectric Supports

Samples of placques produced in accordance with Examples I and II were evaluated for physical properties including glass transition temperature, flammability, dielectric constant, flexural modulus, coefficient of thermal expansion, dissipation factor and moisture absorption. The values obtained are reported in Table 1 below. These properties are compared to those of epoxy resins, polysulfone and polyetherimide.

TABLE I

| Property | Polysulfone[a] | FR-4[b] | Polyetherimide | Example I | Example II |
|---|---|---|---|---|---|
| Tg,(Hdt)°C. | (173) | 125, (135)[d] | 215, (200) | 155, (115) | — |
| Coefficient of Thermal Expansion Z-axis, PPM/°C. | 48 | 55 | Very High 55 PPH | 60–70 | — |
| Flex. Mod. psi × 10$^5$ | 3.9 | 2.8 | 4.8 | 2.5 | 2.8 |
| Flammability UL-94 | V-0 | V-0 | V-0 | — | V-0 |
| Dielectric Const., 1 MHz | 3.0 | 4.8 | 3.1 | 2.7–2.9 | 3.0–3.1 |
| Diss. Factor 1 MHz | 0.003 | 0.02 | 0.005 | 0.006 | 0.005 |
| Moisture Abs. wt % | — | — | 0.25 | 0.03 | |

[a]Udel ® polysulfone, unfilled, provided by Union Carbide
[b]Epoxy resin impregnated glass fiber mat
[c]Ultem ® polyetherimide, unfilled, provided by General Electric
[d]Hdt value higher than Tg is due to glass reinforcement in FR-4.

EXAMPLE III

Preparation of Plaques Comprised of Bulk Polymerized Copolymers from a Halogen Free Catalyst/Cocatalyst System To a clean dry 350 ml bottle with stopper, the following were added with catalyst added last:

| | | | |
|---|---|---|---|
| Methytetracyclododecene (MTD) | 49.1 gm | 50 ml | |
| Hindered Phenol Antioxidant (Isonox 132) | 1.0 gm | | (neat) |
| Polysiloxane (10 centistokes = viscosity) | 0.05 gm | | (neat) |
| Cocatalyst | | | |
| hexamethyldisilizane | 0.26 gm | 0.3 ml | (neat) |
| Bis(tri-n-butyltin) oxide (modifier) | 0.36 gm | 0.3 ml | (neat) |
| Triethylaluminum (0.5M in MTD) | 1.94 gm | 2.0 ml | |
| Ammonium Molybdate catalyst (0.1M in MTD) | 1.96 gm | 2.0 ml | |

The first three items were added simultaneously, followed by the cocatalyst components. After addition of co-catalyst, the bottle was evacuated for 2 minutes, catalyst added and evacuated again for 1 minute. The mixture was shaken and then injected by nitrogen pressure into a ⅛"×8"×8" cavity mold held at about 140° C. After a few minutes, the exothermic reaction began and the temperature rose to about 150° C. The heat was turned off after about 14 minutes and the placque was allowed to cool to 60° C. The placque was demolded after about 1 hour at 60° C. Upon measurement of conversion, the product was found to be about 79% converted. The placque exhibited a dielectric constant of about 2.55 a dissipation factor of about 0.0036, and a glass transition temperature of about 176° C.

CONCLUSION

The dielectric supports of the present invention exhibit dielectric properties either superior or equivalent to those dielectric supports comprised of epoxy resin, polyetherimide or polysulfine. A flammability rating of V-0 can be obtained with a slight loss of the dielectric properties.

As compared to epoxy resins, the dielectric properties of the flame retarded composition are far superior. The glass transition temperatures and heat distortion temperatures of the polymers used in the present invention are also higher than those for epoxy resins. The Hdt values for the epoxy resin impregnated glass fiber mat, FR-4, are higher than the glass transition temperature since the FR-4 board is reinforced with glass. The dielectric supports of Examples I and II are substantially free of fillers and would show the same increase in Hdt values if similarly reinforced.

The polyethermide and polysulfone resins provide higher heat distortion temperatures and slightly lower dielectric properties than the copolymers used in the present invention. This property profile is unique and may have advantages in applications where processability of the materials used in the dielectric support is more important than providing high heat resistance to the finished product. In addition, the copolymers used in the present invention have lower moisture absorption than polyetherimide, as is shown in Table I. Although precise values for the % moisture absorption by polysulfone are not shown for comparison, polysulfone does absorb more moisture than the copolymers used in the present invention due to the presence of the polar "sulfone" groups.

While the invention has been disclosed in this patent application by reference to the details of preferred embodiments of the invention, it is to be understood that this disclosure is intended in an illustrative rather than in a limiting sense, as it is contemplated that modifications will readily occur to those skilled in the art, within the spirit of the invention and the scope of the appended claims.

What is claimed is:

1. A dielectric support for electronic components comprising a crosslinked copolymer having a Tg (Hdt) above about 100° C. and a dielectric constant value in the range from 2.3 MHz to 3.2 MHz, wherein said crosslinked copolymer is made by the bulk polymerization of polymerizable monomer,
   wherein from about 80 weight percent to about 100 weight percent of said polymerizable monomer is composed of a first monomer and other monomer,
   wherein said other monomer is different from said first monomer,
   wherein said first monomer and said other monomer are selected from monomers which conform to Formulas II and III:

II

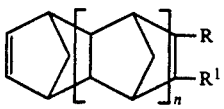

III where n is 1-10, R and $R^1$ are (1) independently selected from hydrogen, alkyl groups of 1 to 12 carbon atoms, alkylene groups of 2 to 12 carbon atoms, cycloalkyl groups of 6 to 20 carbon atoms and aryl groups of 6 to 20 carbon atoms or (2) are combined together to form saturated and unsaturated cyclic groups containing 4-7 carbon atoms with the two ring carbon atoms connected thereto and wherein from at least about 5 weight percent of said polymerizable monomer is of Formulas II and III wherein (1) R or $R^1$ provide mono-unsaturated alkylene groups having 2 to 4 carbon atoms and cycloalkylene groups having 6-20 carbon atoms or (2) R and $R^1$ together form mono-unsaturated cyclic groups of 4 to 7 carbon atoms with the two ring carbon atoms connected thereto.

2. The dielectric support for electronic components of claim 1 wherein said dielectric support is a circuit board for electronic components wherein said electronic components are visible and discernible to the naked eye.

3. The dielectric support for electronic components of claim 1 wherein at least 25 weight percent of said polymerizable monomer comprises dicyclopentadiene.

4. The dielectric support for electronic components of claim 3 wherein said first monomer and said other monomer are selected from the group consisting of methylnorbornene, methyltetracyclododecene, tetracyclododecene, dicyclopentadiene, ethylidenenorbornene, dihydrocyclopentadiene, tricyclopentadiene and tetracyclopentadiene.

5. The dielectric support for electronic components of claim 1 wherein said polymerizable monomer comprises from 50 weight percent to 95 weight percent dicyclopentadiene.

6. The dielectric support for electronic components of claim 5 wherein said polymerizable monomer comprises at least 10 weight percent of monomers of Formula III wherein n is from 1-6 and R and $R^1$ form a 5 membered mono-unsaturated cyclic group with the ring carbons attached thereto.

7. The dielectric support for electronic components of claim 1 wherein said polymerizable monomers are bulk polymerized with a halogen-free catalyst/cocatalyst system.

8. The dielectric support for electronic components of claim 7 wherein said halogen-free catalysts are selected from tridodecylammonium molybdates, tridodecylammonium tungstates, methyltricaprylammonium molybdates, methyltricaprylammonium tungstates, trioctylammonium molybdates and trioctylammonium tungstates and wherein said halogen-free cocatalysts comprise organoaluminum compounds selected from tri($C_2$-$C_{12}$)alkyl aluminum and ($C_2$-$C_4$)alkyl aluminum hydrides.

9. The dielectric support for electronic components of claim 7 circuit board wherein said dielectric support is a circuit board for electronic components wherein said electronic components are visible and discernible to the naked eye.

10. The dielectric support for electronic components of claim 1 wherein said polymerizable monomer is bulk polymerized with a halogen free catalyst and halogen containing cocatalyst components.

11. A dielectric support for electronic components comprised of bulk polymerized copolymer having a Tg (Hdt) above about 100° C. and a dielectric constant value in the range from 2.3 MHz to 3.2 MHz, of at least two norbornene-type monomers each characterized by the presence of the norbornene group, said monomers being selected from the group consisting of monomers that conform to Formulas II and III:

II

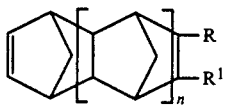

III wherein at least 25% by weight of said copolymer is polymerized from monomers wherein R and $R^1$ form mono-unsaturated cyclic groups.

12. A dielectric support of claim 11 wherein said monomers comprise dicyclopentadiene that comprises from 50% to 95% by weight of the weight of said copolymer.

13. In a process of reactive molding particulate additive containing cycloolefin monomer(s) by mixing at least two liquid streams of monomers each containing at least one norbornene group, wherein the various components of a total metathesis catalyst package are present in different streams so that the catalyst is only fully activated upon mixing, and then conveying the mixture to a heated mold wherein the mixture polymerizes, the improvement comprising
(a) uniformly dispersing a particulate additive in a polymeric material that does not adversely affect the metathesis catalyst system and that is soluble in the norbornene group-carrying monomers; and
(b) dissolving the polymeric material containing the dispersed particulate additive in one or more of the liquid streams or the material out of which the streams are formed, said streams or said material being substantially free of particulate additive before said dissolution step and containing a fairly uniform distribution of the particulate additive after said dissolution step.

14. In the process of claim 13 the further improvement wherein the process is reaction injection molding.

15. In the process of claim 13 the further improvement wherein the polymeric material is a solid or a viscous liquid at room temperature.

16. In the process of claim 15 the further improvement wherein the polymeric material is a hydrocarbon elastomer.

17. In the process of claim 15 the further improvement wherein the dispersion of particulate additive in the polymeric material contains up to about 50 weight percent of particulate additive.

18. In the process of claim 17 the further improvement wherein the particulate additive content of the dispersion is about 35 weight percent or less.

19. In the process of claim 18 the further improvement wherein the dispersion is formed in a Banbury mixer.

20. In the process of claim 18 the further improvement wherein the particulate additive is selected from the group consisting of carbon black, titanium dioxide, red iron oxide and other pigments.

21. In the process of claim 18 the further improvement wherein between 1.5 and 15 parts of the polymeric dispersion are added per 100 parts of norbornene group-containing monomer.

22. The process of claim 18 wherein
(a) said monomer mixture comprises mostly dicyclopentadiene;
(b) said polymeric material comprises a hydrocarbon elastomer;
(c) up to about 35 weight percent of said particulate additive is dispersed in said hydrocarbon elastomer; and
(d) between about 1.5 and 15 parts of said polymer dispersion are added per 100 parts of said monomer mixture.

23. The process of claim 22 wherein
(a) the monomer mixture comprises between about 80 and 95 weight percent dicyclopentadiene;
(b) the other monomers present are selected from the group consisting of methyltetracyclododecene; ethylidene norbornene, cyclopentadiene trimers and tetramers and mixtures thereof; and
(c) the particulate additive is selected from the group consisting of carbon black, titanium dioxide, red iron oxide and other pigments.

24. A method as in claim 28 wherein the process is a reaction injection molding process which produces a circuit board.

25. A process of claim 24 wherein said dispersion of particulate additive is in a polymeric material comprising a hydrocarbon elastomer and contains up to 50 weight percent of particulate additive.

26. A process of claim 25 wherein said particulate additive is selected from the group consisting of carbon black, titanium dioxide, red iron oxide, and other particulate pigments.

27. A process of claim 26 wherein between 10 and 15 parts of said polymeric dispersion are added per 100 parts of norbornene group-containing monomer.

28. A process of reactive molding particulate additive-containing cycloolefin monomers comprising
mixing at least two liquid streams of monomers wherein each of said monomers comprises at least one norbornene group, and
wherein the several components of a total metathesis catalyst package comprising an organoammonium molybdate or an organoammonium tungstate catalyst, an aluminum based cocatalyst, and a halometal activator are present in different of said streams, so that said catalyst is only fully activated upon mixing of said streams,
uniformly dispersing a particulate additive in a polymeric material that does not adversely affect the metathesis catalyst system and that is soluble in the norbornene group carrying monomers,
dissolving said polymeric material containing said dispersed particulate additive in one or more of said liquid streams or in the material out of which the streams are formed, and then conveying said mixture of said streams to a heated mold wherein said mixture is polymerized.

29. A process of claim 28 wherein the process is reaction injection molding.

30. A process of claim 28 wherein said polymeric material is a solid or a viscous liquid at room temperature.

31. A process of claim 30 wherein said polymeric material is a hydrocarbon elastomer.

32. A process of claim 28 wherein said dispersion of particulate additive in said polymeric material comprises up to 50 weight percent of particulate additive.

33. A process of claim 32 wherein said dispersion is 35 weight percent or less.

34. A process of claim 33 wherein said dispersion is formed in an extruder or Banbury mixer.

35. A process of claim 32 wherein said particulate additive is selected from the group consisting of carbon black, titanium dioxide, red iron oxide, and other particulate pigments.

36. A process of claim 33 wherein between 1.5 and 15 parts of said polymeric dispersion are added per 100 parts of norbornene-group containing monomer.

37. A process of claim 28 wherein said cocatalyst of the metathesis catalyst package is an alkoxyalkylaluminum, arloxyalkylaluminum, alkoxyalkylaluminum halide or an aryloxyalkylaluminum halide, and said activator is an alkylsilicon halide or a tetahalosilane.

38. A process of claim 28 wherein said activator of the metathesis catalyst system is silicon tetrachloride.

* * * * *